(12) United States Patent
Kakkar (10) Patent No.: US 11,573,079 B2
(45) Date of Patent: Feb. 7, 2023

(54) LIGHTING SYSTEM WITH PATTERN ELEMENT

(71) Applicant: Lumileds LLC, San Jose, CA (US)

(72) Inventor: Varun Dev Kakkar, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/829,423

(22) Filed: Jun. 1, 2022

(65) Prior Publication Data
US 2022/0290980 A1    Sep. 15, 2022

Related U.S. Application Data

(63) Continuation of application No. 16/748,317, filed on Jan. 21, 2020, now Pat. No. 11,359,914.

(30) Foreign Application Priority Data

Jan. 21, 2019    (EP) ................................ EP19152837

(51) Int. Cl.
| | | |
|---|---|---|
| *G02B 27/09* | (2006.01) | |
| *G01B 11/25* | (2006.01) | |
| *H01L 25/075* | (2006.01) | |
| *H01L 33/48* | (2010.01) | |
| *H01L 33/60* | (2010.01) | |

(52) U.S. Cl.
CPC ...... *G01B 11/2531* (2013.01); *G02B 27/0927* (2013.01); *G02B 27/0944* (2013.01); *H01L 25/0753* (2013.01); *H01L 33/486* (2013.01); *H01L 33/60* (2013.01)

(58) Field of Classification Search
CPC ............ G02B 27/0922; G02B 27/0916; G02B 19/0066
See application file for complete search history.

(56) References Cited

U.S. PATENT DOCUMENTS

| | | |
|---|---|---|
| 6,527,419 B1 | 3/2003 | Galli |
| 7,988,318 B1 | 8/2011 | Smith et al. |
| | (Continued) | |

FOREIGN PATENT DOCUMENTS

| | | |
|---|---|---|
| GB | 2473311 A | 3/2011 |
| WO | WO-2011131197 A1 | 10/2011 |

OTHER PUBLICATIONS

"U.S. Appl. No. 16/748,317 Preliminary Amendment filed Jul. 1, 2021", 6 pgs.

(Continued)

*Primary Examiner* — Andrew J Coughlin
(74) *Attorney, Agent, or Firm* — Schwegman, Lundberg & Woessner, P.A.

(57) ABSTRACT

A lighting system is described that includes a first lighting device, a second lighting device and a pattern element. The first lighting device includes at least one individual light-emitting element configured to emit light with a first beam profile. The second lighting device includes at least one individual light-emitting element configured to emit light with a second beam profile such that a third beam profile, different from the first beam profile and the second beam profile, is provided as a combination of the first beam profile and the second beam profile. The pattern element is configured to generate a pattern on at least one of the first beam profile and the second beam profile and a pattern on the third beam profile.

21 Claims, 4 Drawing Sheets

(56) References Cited

U.S. PATENT DOCUMENTS

| | | |
|---|---|---|
| 10,203,094 B2 | 2/2019 | Hsu et al. |
| 2004/0223342 A1 | 11/2004 | Klipstein et al. |
| 2008/0211428 A1 | 9/2008 | Bayat et al. |
| 2014/0197314 A1 | 7/2014 | Afrooze et al. |
| 2016/0209729 A1 | 7/2016 | Hudman |
| 2017/0359883 A1 | 12/2017 | Ansari et al. |
| 2020/0232790 A1 | 7/2020 | Kakkar |
| 2020/0340637 A1* | 10/2020 | Yeo .................. F21S 8/026 |

OTHER PUBLICATIONS

"U.S. Appl. No. 16/748,317, Notice of Allowance dated Feb. 25, 2022", 8 pgs.

"U.S. Appl. No. 16/748,317, Response filed Jan. 6, 2022 to Restriction Requirement dated Nov. 23, 2021", 7 pgs.

"U.S. Appl. No. 16/748,317, Restriction Requirement dated Nov. 23, 2021", 6 pgs.

"European Application Serial No. 19152837.1, extended European Search Report dated Apr. 25, 2019", 8 pgs.

"International Application Serial No. PCT/EP2020/050710, International Search Report dated Feb. 27, 2020", 4 pgs.

"International Application Serial No. PCT/EP2020/050710, Written Opinion dated Feb. 27, 2020", 8 pgs.

\* cited by examiner

LIGHTING SYSTEM WITH PATTERN ELEMENT

CROSS REFERENCE TO RELATED APPLICATION(S)

This application is a division of U.S. application Ser. No. 16/748,317, filed Jan. 21, 2020, which claims the benefit of EP Patent Application 19152837.1 filed Jan. 21, 2019, which are incorporated by reference as if fully set forth.

FIELD OF INVENTION

The present disclosure relates to lighting systems comprising lighting devices configured to generate patterned beam profiles, in particular in the area of pattern illuminators for 3D imaging purposes.

BACKGROUND

In recent years, 3D imaging has become increasingly important in industrial and consumer applications. 3D imaging can be used for a wide range of applications, such as identification, authentication and/or machine vision. Means to perform 3D imaging have already been incorporated in mobile devices.

For illumination in 3D imaging, various types of light patterns are used, for example dot patterns, crosses, grids and lines. Such light patterns are typically generated by laser devices such as VCSEL arrays. The distortion of the light pattern on an object under investigation may be analysed to obtain depth information, from which a 3D representation of the object may be derived.

In principle, as an alternative for laser light sources, light emitting diodes (LEDs) could provide suitable light sources for 3D imaging. While LEDs may emit sufficient intensities for 3D imaging, LED devices are typically subject to high heat loads. In case a large range of distances of the object under investigation and the light source is needed, a lighting device with a wider angle emission angle and high flux is required, significantly increasing the drive current and heat generation when LEDs are used. Further, the precision in depth sensing based on optical methods may still be further improved.

US 2014/197314 A1 discloses a method for generating an infrared (IR) beam for illuminating a scene to be imaged, the method comprising providing at least two IR emitters, including a first IR emitter operable to emit a wide beam component of the IR beam, and a second IR emitter operable to emit a narrow beam component of the IR beam, wherein the wide beam component has a linear profile that has a lower standard deviation than a linear profile of the narrow beam component. The method also comprises selecting a desired linear profile for the IR beam, and selecting a power ratio of power directed to the first IR emitter and power directed to the second IR emitter that produces the IR beam with the desired linear profile when the narrow beam component and wide beam component are combined; and directing power to the first and second IR emitters at the selected power ratio to generate the wide and narrow beam components, and combining the generated wide and narrow beam components to produce the IR beam.

SUMMARY

It is therefore an object of the present invention to provide a lighting system that is capable of illuminating objects for 3D imaging for a large range of distances and wider view angles, while in particular the heat generation in the lighting system may be limited. The invention further relates to a method for producing such a lighting system and a use of such a lighting system based on the aforementioned object.

According to a first aspect of the present invention, a lighting system is provided comprising: a first lighting device configured to generate a first beam profile, wherein the first lighting device comprises at least one individual light-emitting element; a second lighting device configured to generate a second beam profile, wherein the second lighting device comprises at least one individual light-emitting element; wherein the lighting system is configured to combine the first beam profile and the second beam profiles into a total beam profile; and a pattern element configured to generate a pattern on the first beam profile and/or the second beam profile, wherein the lighting system is configured to provide a third beam profile, different from the first and the second beam profile such that at least three different beam profiles are obtained, wherein the lighting system is configured to combine the first beam profile and the second beam profile into the third beam profile; and the pattern element is configured as a pattern element arranged in the lighting system, generating a pattern on both the first beam profile, the second beam profile and the third beam profile.

According to a second aspect of the present invention, a method for producing a lighting system is provided, the method comprising: providing a first lighting device comprising at least one individual light-emitting element configured to generate a first beam profile; providing a second lighting device comprising at least one individual light-emitting element configured to generate a second beam profile, wherein the first lighting device and second lighting device are arranged such that the first beam profile and the second beam profile are combined into a total beam profile; and providing a pattern element configured to generate a pattern on the first beam profile and/or the second beam profile, wherein the lighting system is configured to provide a third beam profile, different from the first and the second beam profile such that at least three different beam profiles are obtained, wherein the lighting system is configured to combine the first beam profile and the second beam profile into the third beam profile; and the pattern element is configured as a pattern element arranged in the lighting system, generating a pattern on both the first beam profile, the second beam profile and the third beam profile.

According to a third aspect of the present invention, a use of a lighting system according to the first aspect is provided to determine depth information of an object illuminated by the lighting system.

Exemplary embodiments of the first, second and third aspect of the invention may have one or more of the properties described below.

The at least one individual light-emitting element of the first and/or second lighting device may comprise an LED. The at least one individual light-emitting element of the first lighting device may be different from the at least one individual light-emitting element of the second lighting device. For example, the types, size and/or provided intensity of the at least one individual light-emitting element of the first lighting device may differ from the at least one individual light-emitting element of the second lighting device.

A first/second beam profile may be generated when an object is illuminated by the first/second lighting device. For instance, the generated beam profiles may have different shapes and/or intensities. A first/second beam profile may be understood as the illumination pattern that is generated by the first/second lighting device when an object like a screen is brought at a given distance before the lighting system. That is, the beam profile may be described by the illuminance depending on the distance and the angular orientation, e.g. the angles relative to an optical axis of the lighting device and the distance of the object relative to the lighting device.

The lighting system is configured to combine the first beam profile and the second beam profiles into a total beam profile. Hence, the lighting system is configured such that an object under investigation may be illuminated together by the first and second lighting device when first and second lighting devices are activated at the same time. For instance, the first lighting device and the second lighting device may be orientated such that the first and second lighting devices emit light substantially towards the same direction, e.g. optical axes of the lighting devices are orientated substantially along the same direction. The first beam profile and the second beam profile may have intensities adjacent to each other or overlapping intensities in at least at some distances to the lighting system.

Further, only the first lighting device or only the second lighting device may be activated, such that only the first or second beam profile is generated. Hence, with the lighting system according to the invention, at least three different beam profiles may be obtained.

A pattern element of the lighting system may be any optical element configured to generate a pattern on the generated beam profile. In particular, the pattern element is configured to absorb and/or reflect light emitted by the first and/or second lighting device such that regions of the first and/or second beam profile are reduced in intensity and/or increased in intensity compared to the first and/or second beam profile that occurs without the pattern element. The pattern element may be configured as a single pattern element arranged in the lighting system, generating a pattern on both the first and second beam profiles. The pattern element may also comprise separated sub-pattern elements. For example, the pattern element may generate a first pattern on the first beam profile and a second pattern on the second beam profile. The pattern is in particular a regular pattern that is suitable for analysis in 3D imaging. For instance, the pattern may be a (regular) line pattern, dot pattern, rectangular or square pattern.

In an exemplary embodiment of the invention, the lighting system is configured to combine a first pattern generated by the pattern element on the first beam profile and a second pattern generated by the pattern element on the second beam profile into a total pattern on the total beam profile. For example, a first pattern can be generated on a first beam profile when only the first lighting device is in operation. A second pattern can be generated on a second beam profile when only the second lighting device is in operation. When both the first and second lighting devices are activated, a total pattern on the total beam profile may be different or similar to the first and second pattern.

The first pattern and second pattern may be configured as matching patterns. For instance, the first pattern and the second pattern may be formed of a similar or identical line patterns with the same period. The first pattern and second pattern may be matched in that the first and second pattern combine in a constructive manner into the total (line) pattern, e.g. maxima and minima of the first pattern and the second pattern are situated at similar/identical positions in the total pattern. In other embodiments, the first and second pattern may be complementary and may in particular have different contributions to the total (line) pattern.

Alternatively, the generated first pattern is different from the generated second pattern. The first pattern and the second pattern may be complementary patterns. For example, the first pattern may form horizontal lines in the first beam profile and the second pattern may form vertical lines in the second beam profile, with the total pattern comprising a rectangular pattern as a result of the combination of the first and second beam profiles.

In an exemplary embodiment of the invention, the first beam profile is different from the second beam profile. For example, the shapes and/or the intensity of the first beam profile and the second beam profile may be different. Therefore, the first and second beam profiles may be used to illuminate objects under different conditions. For instance, the angular dependence of the illuminance of the first and second beam profile may be different. Hence, the shape of a "spot" provided by each of the lighting devices may be different, with the combination of the lighting devices yielding another beam profile. The illumination of an object can therefore be adapted by activating only the first lighting device, only the second lighting device, or by activating both lighting devices to obtain the total beam profile.

According to another exemplary embodiment of the invention, the first beam profile has a first distance dependence and the second beam profile has a second distance dependence, the first distance dependence and the second distance dependence being different from each other. For instance, the first beam profile may be suitable for far distances and/or a narrow field of view, while the second beam profile may suitable for shorter distances and/or a wider field of view. Hence, the lighting system is capable to provide illumination of objects with a pattern in a wider range of distances and/or a wider field of view. Further, by analysing the contribution of each lighting device to the illumination on an object under investigation, information on the distance of the object to the lighting system may be derived.

For instance, if an object is close to the lighting system, a first beam profile suitable for far distances may provide lower illumination and a second beam profile suitable for shorter distances may provide higher illumination. Vice versa, when the object is far from the lighting system, the first beam profile suitable for far distances may provide higher illumination and a second beam profile suitable for shorter distances may provide lower illumination. Hence, in addition or as alternative to the depth information that may be derived from an analysis of the pattern, the relative illumination generated by the lighting devices with different distance dependences provides distance information.

According to an exemplary embodiment of the invention, a shape of the first beam profile surrounds a shape of the second beam profile; or a shape of the second beam profile surrounds a shape of the first beam profile. That is, at least in some distances of the object or screen to the lighting system, the first beam profile may at least partially surround or enclose the second beam profile or vice versa. For example, the first beam profile may have a circular shape, where the area within the circle is illuminated. The second beam profile may have a ring shape, with area of the ring being illuminated and a centre area of the ring being not illuminated. The first beam profile and the second beam profile may be combined such that the ring encloses the circle.

According to another exemplary embodiment of the invention, the first lighting device and/or the second lighting device is configured to generate a first beam profile and/or a second beam profile having a decreasing intensity from a profile centre to a profile edge. For example, a beam profile has a circular shape, where the area within the circle is illuminated. The illuminated intensity have a maximum intensity at the centre of the circle and with angles leading away from the circle center, the intensity of the beam profile is reduced.

According to another exemplary embodiment of the invention, the first lighting device and/or the second lighting device is configured to generate a first beam profile and/or a second beam profile having an increasing intensity from a profile center to a profile edge. For example, a beam profile has a ring shape, where the intensity has a minimum at the centre of the ring. The intensity may increase to a maximum at the radius of the ring. At higher angles from the centre, the intensity may again be decreased.

According to another exemplary embodiment of the invention, the total beam profile, without the pattern generated by the pattern element, has at least one local minimum in intensity, wherein the at least one local minimum in intensity of the total beam profile is located between two local maxima in intensity. Here, the local minimum and the local maxima in intensity are referring to local minima and maxima of the total beam profile without the influence of the pattern element, i.e. the total beam profile that is obtained when the pattern element is omitted. In this sense, the local minimum and the local maxima in intensity of the total beam profile are to be distinguished from the minima and maxima generated by the pattern element, e.g. the maxima and minima of a line pattern generated by the pattern element.

For instance, the total beam profile has one local minimum in intensity and two local maxima in intensity (e.g. in dependence of an angle relative to an optical axis of the lighting system), wherein the local minimum is located between these two local maxima of the beam profile. In the aforementioned combination of a circular shape and a ring shape of the beam profiles, the local minimum in intensity may form a "dark" or "darker" ring between the circular shape and the ring shape. That is, a (local) maximum may be in the centre of the total beam profile caused by the circular beam profile. When the angle from the centre is increased, a local minimum may be reached between the circular beam profile and the ring shaped beam profile, which is visible in the total beam profile as "dark" ring. When the angle is further increased, a second (local) maximum in intensity may be reached that is caused by the "bright" ring shaped beam profile. The position of the local minimum may give a calibration reference for an object illuminated by the lighting system, e.g. in applications like depth mapping. The width of the local minimum can be optimized for different sizes and/or distances of objects under investigation.

According to an alternative exemplary embodiment of the invention, the lighting system is configured to illuminate an object with a total beam profile having a substantially uniform intensity distribution in a region. In the aforementioned combination of a circular shape and a ring shape of the beam profiles, the circle and ring may be combined into a (larger) circular shaped total beam profile that has a substantially uniform intensity distribution in a region, e.g. up to at least a certain angle. Hence, the lighting system may provide for a wider field of view than a single lighting device, wherein in addition the field of view may for example be varied by only activating the lighting device with a circular beam profile or by activating both lighting devices.

According to another exemplary embodiment of the invention, the pattern element is configured as a line pattern projector element comprising one or more gratings having light-blocking sections and light-permeable sections. With at least one grating, a line pattern may be obtained by absorption and/or reflection of light at the light-blocking sections. In particular, a combination of at least two gratings is used, the gratings having the same pitch and being arranged parallel to each other.

According to another exemplary embodiment of the invention, the first lighting device and second lighting device are arranged in a common package, in particular together with the pattern element. The first lighting device and the second lighting devices may be arranged in a lead frame package. Alternatively, the pattern element may be arranged outside of the lead frame package.

According to another exemplary embodiment of the invention, the lighting system further comprises at least one optical element. For instance, an optical element may comprise a lens, e.g. a Fresnel lens, and/or may comprise at least one reflector cup, in particular a reflector cup for the first lighting device and/or a reflector cup for the second lighting device. A reflector cup may effectively reflect light emitted from the light-emitting element. The reflector cup may be configured as element with high (specular and/or diffuse) reflectance that surrounds the light-emitting element. The reflector cup may have a shape that is adapted to the geometry of the spatial distribution of light emission of the light-emitting element and to produce a specific first and/or second beam profile. The amount of light provided by the light-emitting element for illumination may also be further optimized. In an embodiment, the reflector cup may also serve as support for the pattern element, such that the lighting device can be arranged in a very compact manner.

It is to be understood that the presentation of embodiments of the invention in this section is merely exemplary and non-limiting.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

BRIEF DESCRIPTION OF THE DRAWING(S)

Examples of the invention will now be described in detail with reference to the accompanying drawing, in which.

DETAILED DESCRIPTION OF THE PREFERRED EMBODIMENT(S)

Figure 1:
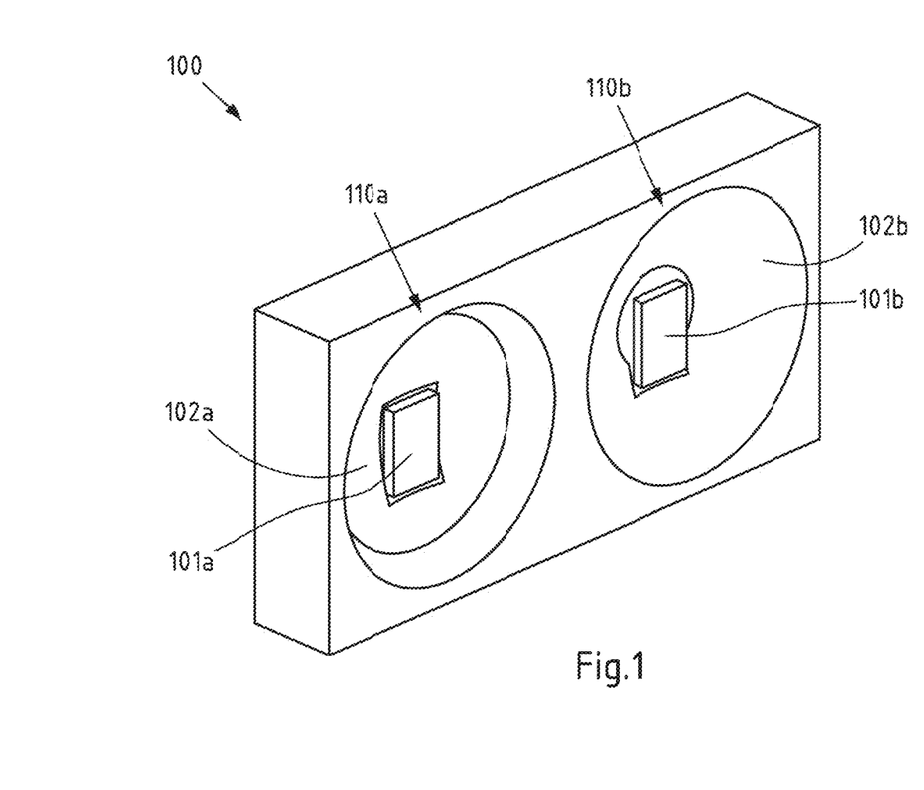
FIG. 1 schematically shows a lighting system comprising two lighting devices according to the invention.

A lighting system 100 comprising two lighting devices 110a, 110b is illustrated in FIG. 1. The first lighting device 110a comprises one individual LED 101a as light-emitting element and a reflector cup 102a having a reflective surface. The second lighting device 110b comprises one individual LED 101b as light-emitting element and a reflector cup 102b having a reflective surface. The first lighting device 110a is configured to generate a first beam profile. The second lighting device 110b is configured to generate a second beam profile. The beam profiles are different from each other due to different configurations of the reflector cups 102a, 102b. Further, the lighting system 100 comprises a pattern element (not depicted in FIG. 1).

Figure 2:
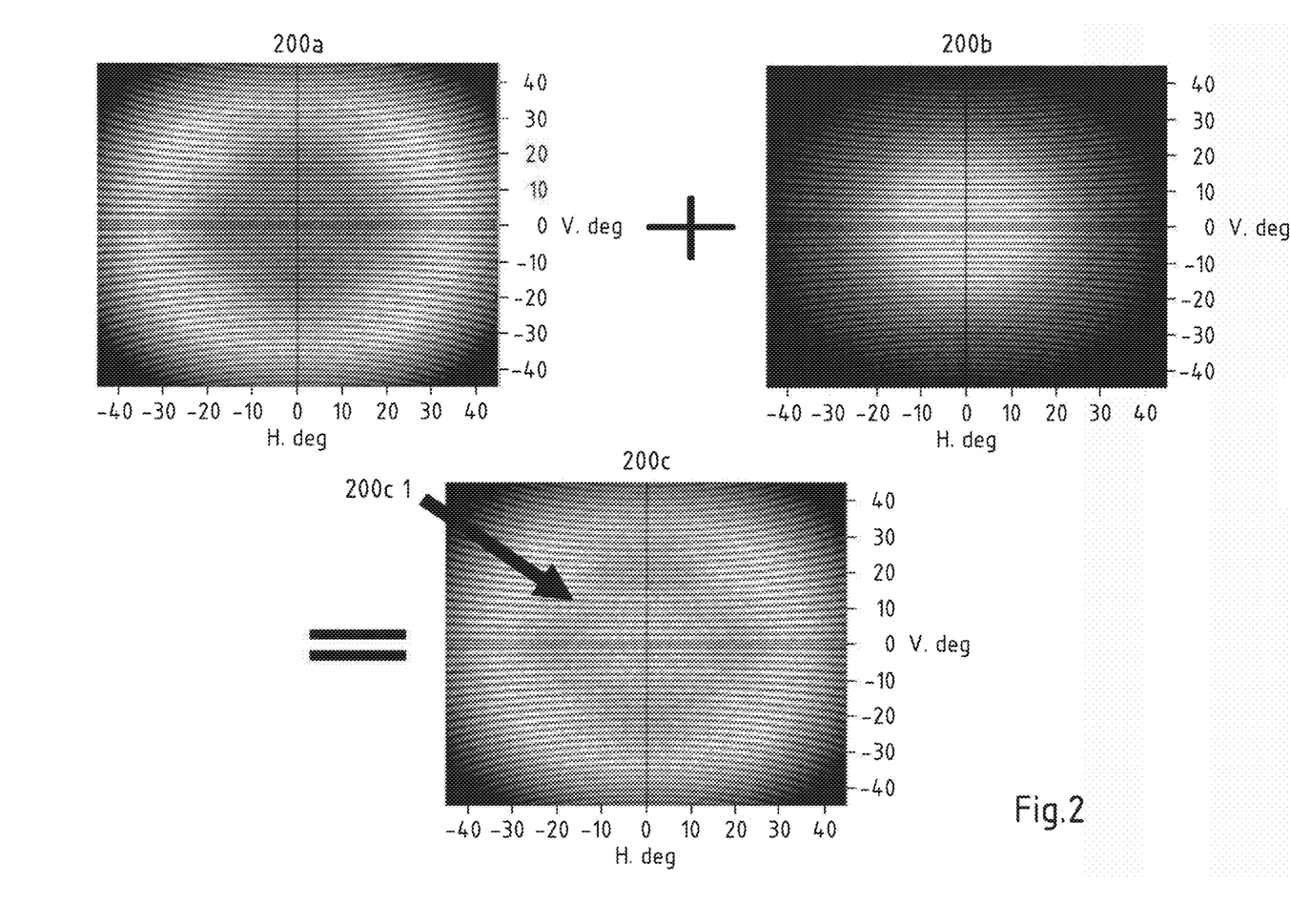
FIG. 2 schematically shows two examples for first and second beam profiles generated by the first and second lighting devices and one example of a total beam profile of a lighting system according to an embodiment of the invention.

FIG. 2 schematically shows two examples for beam profiles 200a, 200b generated by the lighting devices and one example total beam profile 200c combined by the lighting system according to a second embodiment of the invention.

A first beam profile 200a is generated by a first lighting device (e.g. by the first lighting device 110a in FIG. 1) of a lighting system (e.g. the lighting system 100 in FIG. 1). A pattern with lines is generated on the first beam profile 200a by the pattern element of the lighting system, wherein the pattern element is configured as a line pattern projector element comprising one or more gratings having light-blocking sections and light-permeable sections. The first beam profile 200a has an increasing intensity from the profile centre to the profile edge in that the first beam profile 200a comprises a ring shape. The centre of the first beam profile 200a has a minimum in illuminance, resulting in a dark centre region.

A second beam profile 200b is generated by a second lighting device (e.g. by the second lighting device 110b in FIG. 1) of the lighting system. A pattern with lines is generated on the beam profile 200b by the line pattern projector element. The second beam profile 200b has a decreasing intensity from the profile centre to the profile edge. As can be seen in FIG. 2, the second beam profile 200b has a circular shape. Hence, the first beam profile 200a generated by the first lighting device is different from the second beam profile 200b generated by the second lighting device.

The first beam profile 200a has a first distance dependence and the second beam profile 200b has a second distance dependence. Furthermore, the first distance dependence and the second distance dependence are different from each other. By selective activation of the first lighting device 110a and the second lighting device 110b, illumination may be provided for a larger range of distances. Further, by comparing the (relative) illumination by the first lighting device 110a and the second lighting device 110b, information on the distance of the object to the lighting system 100 may be obtained.

The lighting system 100 is configured to combine the first beam profile 200a and the second beam profiles 200b into a total beam profile 200c with the line pattern generated by the line pattern projector element. As can be seen in FIG. 2, the total beam profile 200c (also without the pattern generated by the line pattern projector element) has one local minimum 200c_1 in intensity, which is located between the two local maxima in intensity, the two local maxima being formed at the centre from the second beam profile 200b and at the ring from the first beam profile 200a. The first local maximum in intensity is illustrated in the middle area as a bright dot and the second local maximum in intensity is illustrated at the edge of the total beam profile 200c as a bright ring. The dark ring illustrated between the first local maximum in intensity (the bright dot in the middle) and the second local maximum in intensity (the bright ring at the edge) represents the local minimum 200c_1 in intensity of the total beam profile 200c. Depth information of an object illuminated by the lighting system can be determined based on the beam profiles 200a, 200b and 200c. Further, the local minimum 200c_1 may provide a calibration reference for an object illuminated by the lighting system.

Figure 3:
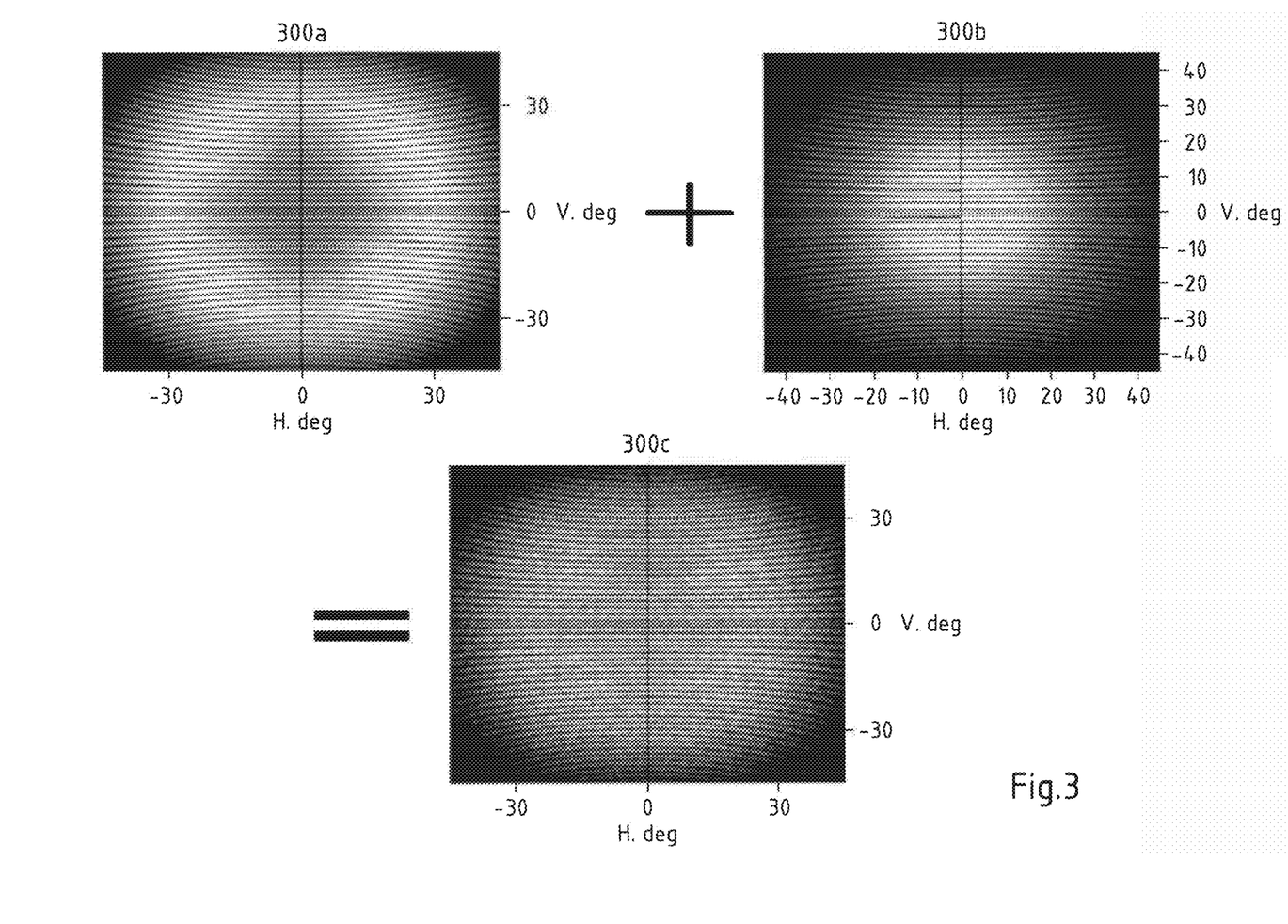
FIG. 3 schematically shows two examples for first and second beam profiles generated by the first and second lighting devices and one example of a total beam profile of a lighting system according to another embodiment of the invention.

FIG. 3 schematically shows two examples for beam profiles generated by the lighting devices and one example total beam profile combined by the lighting system according to another embodiment of the invention.

In FIG. 3, a first beam profile 300a is generated by a first lighting device (e.g. by the first lighting device 110a in FIG. 1) of a lighting system (e.g. the lighting system 100 in FIG. 1). A second beam profile 300b is generated by a second lighting device (e.g. by the second lighting device 110b in FIG. 1) of the lighting system. As can be seen in FIG. 3, the first beam profile 300a has an increasing intensity from the profile centre to the profile edge similar to the first beam profile 200a in FIG. 2. The second beam profile has a decreasing intensity from the profile centre to the profile edge is similar to the beam profile 200b in FIG. 2. However, in this embodiment, the first and second lighting devices are configured such that the first beam profile 300a and the second beam profile 300b may be combined to a total beam profile 300c having a substantially uniform intensity distribution in a region. The first beam profile 300a has a wider view and is suitable for objects at short distances to the lighting system 100. The second beam profile 300b has a narrow view and is suitable for objects in far distance. Therefore, objects with significantly different widths may be illuminated by the lighting system by means of selectively activating the first and/or second lighting device.

Figure 4:
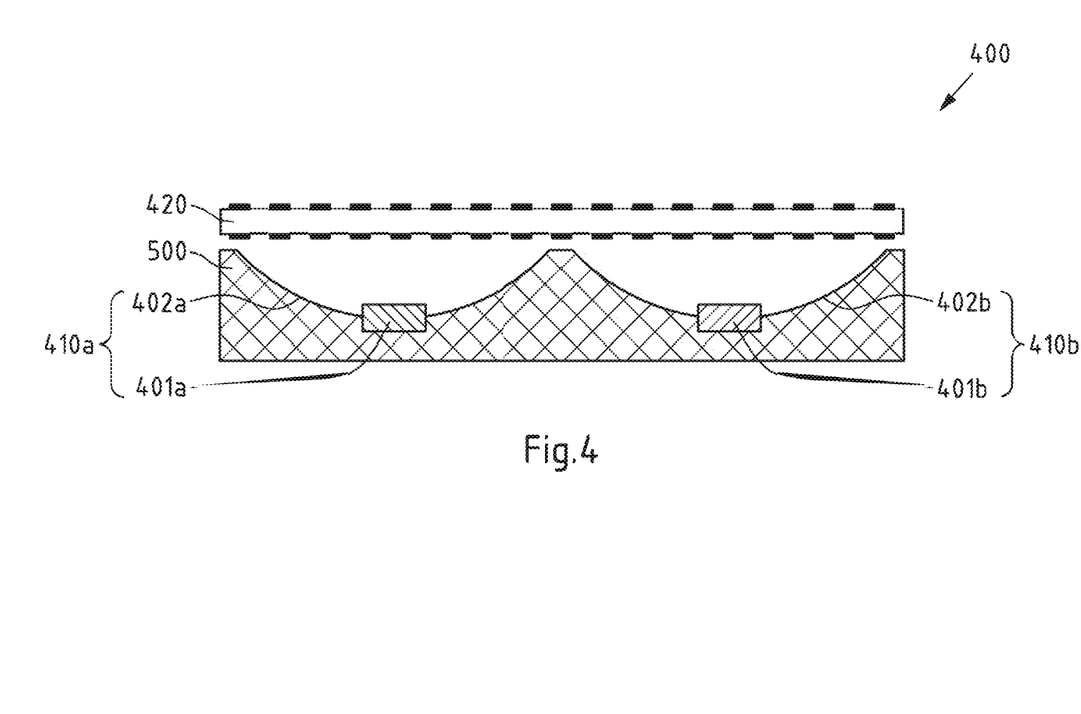
FIG. 4 schematically shows a sectional view of a lighting system according to the invention.

FIG. 4 schematically shows a sectional view of a lighting system 400 within a lead frame package according to the invention. The lighting system 400 comprises a first lighting device 410a and a second lighting device 410b and a line pattern projector element 420. Each lighting device 410a or 410b comprises one LED chip (reference numerals 401a for 410a and 401b for 410b) and one reflector cup (reference numerals 402a for 410a and 402b for 410b), respectively.

The lighting devices 410a, 410b with the LED chips 401a, 401b and the reflector cups 402a, 402b are formed and packaged within a lead frame package 500. The line pattern projector 420 is arranged outside of the lead frame package 500. Optionally, the line pattern projector 420 can also be formed with the lighting devices and reflectors within a common lead frame package.

What is claimed is:

1. An illumination method comprising:
   generating a first beam profile to illuminate an object using a light-emitting element of a first lighting device of a lighting system;
   generating a second beam profile to illuminate the object using a light-emitting element of a second lighting device of the lighting system, the first beam profile and the second beam profile able to be generated selectively such that at least three beam profiles are able to be obtained, the three beam profiles comprising the first beam profile, the second beam profile, and a total beam profile that is a combination of the first beam profile and the second beam profile;

generating, using a pattern element, a pattern on the first beam profile to form a first pattern and the second beam profile to form a second pattern; and combining the first and the second patterns to form a total pattern that is adjustable to be different from the first and the second patterns individually.

2. The method of claim 1, further comprising determining depth information of the object illuminated by the total pattern.

3. The method of claim 2, further comprising using the total pattern as a calibration reference for the object using the depth information.

4. The method of claim 1, further comprising generating the first beam profile and the second beam profile to have at least one characteristic including characteristics of different shapes and different intensities.

5. The method of claim 1, further comprising orienting optical axes of the first lighting device and the second lighting device substantially along a same direction.

6. The method of claim 1, further comprising generating the total pattern using a single pattern element.

7. The method of claim 1, further comprising generating the total pattern using sub-pattern elements of the pattern element to generate a first pattern on the first beam profile and a second pattern on the second beam profile.

8. The method of claim 1, further comprising generating the total pattern using a regular pattern selected from a set of regular patterns that include a line pattern, a dot pattern, a rectangular pattern, and a square pattern.

9. The method of claim 8, wherein:
the first pattern and the second pattern are matching patterns, and
generating the total pattern comprises constructively combining the first pattern and the second pattern such that maxima and minima of the first pattern and the second pattern are situated at essentially identical positions in the total pattern.

10. The method of claim 8, wherein:
the first pattern and the second pattern are complementary patterns, and
generating the pattern comprises combining the first pattern and the second pattern to provide different contributions to the total pattern such that maxima and minima of the first pattern and the second pattern are situated at different positions in the total pattern.

11. The method of claim 1, wherein:
the first beam profile has a first distance dependence,
the second beam profile has a second distance dependence that is different from the first distance dependence such that the second beam profile is suitable for at least one of a shorter distance or a wider field of view than the first beam profile, and
further comprising analysing a contribution of the lighting element of each of the first lighting device and the second lighting device to an illumination level of the object to determine a distance of the object to the lighting system.

12. The method of claim 11, further comprising illuminating the object differently based on the distance of the object to the lighting system such that a relative intensity of illumination of the first beam profile is lower than illumination of the second beam profile at distances of the object less than a predetermined distance and the relative intensity of illumination of the first beam profile is higher than an illumination level of the second beam profile at distances of the object greater than a predetermined distance.

13. The method of claim 12, further comprising determining the distance of the object to the lighting system based on the illumination provided by the first and second beam profiles.

14. The method of claim 1, wherein the first beam profile at least partially surrounds or encloses the second beam profile to form the total beam profile.

15. The method of claim 14, wherein the second beam profile has a circular shape in which an area within a circle is illuminated and the first beam profile has a ring shape in which the area of the circle is not illuminated.

16. The method of claim 1, wherein at least one of the first beam profile and the second beam profile has a changing intensity from a center of the at least one of the first beam profile and the second beam profile to an edge of the at least one of the first beam profile and the second beam profile.

17. The method of claim 1, wherein:
the total beam profile, without the pattern generated by the pattern element, has a local minimum level of intensity, and
the local minimum is located between two local maxima levels of intensity.

18. The method of claim 17, wherein:
the first beam profile at least partially surrounds or encloses the second beam profile to form the total beam profile,
the second beam profile has a circular shape in which an area within a circle is illuminated and the first beam profile has a ring shape in which the area of the circle is not illuminated, and
the local minimum is located between the circular shape and the ring shape.

19. An illumination method comprising:
generating a first beam profile to illuminate an object using a light-emitting element of a first lighting device of a lighting system;
generating a second beam profile to illuminate the object using a light-emitting element of a second lighting device of the lighting system, the first beam profile and the second beam profile able to be generated selectively such that at least three beam profiles are able to be obtained, the three beam profiles comprising the first beam profile, the second beam profile, and a total beam profile that is a combination of the first beam profile and the second beam profile, the first beam profile at least partially surrounding or enclosing the second beam profile to form the total beam profile;
generating, using a pattern element, a pattern on the first beam profile to form a first pattern and the second beam profile to form a second pattern; and
combining the first and the second patterns to form a total pattern that is adjustable to be different from the first and the second patterns individually.

20. The method of claim 19, wherein:
the second beam profile has a circular shape in which an area within a circle is illuminated and the first beam profile has a ring shape in which the area of the circle is not illuminated,
the first beam profile and the second beam profile are contiguous, and
an intensity of the total beam profile is substantially constant.

21. An illumination method comprising:
- generating a first beam profile to illuminate an object using a light-emitting element of a first lighting device of a lighting system;
- generating a second beam profile to illuminate the object using a light-emitting element of a second lighting device of the lighting system, the first beam profile and the second beam profile able to be generated selectively such that at least three beam profiles are able to be obtained, the three beam profiles comprising the first beam profile, the second beam profile, and a total beam profile that is a combination of the first beam profile and the second beam profile, the first beam profile generated to have a different configuration than the second beam profile by a first reflector cup around the light-emitting element of the first lighting device that has a different shape than a second reflector cup around the light-emitting element of the second lighting device;
- generating, using a pattern element, a pattern on the first beam profile to form a first pattern and the second beam profile to form a second pattern; and
- combining the first and the second patterns to form a total pattern that is adjustable to be different from the first and the second patterns individually.

* * * * *